United States Patent
Duffield et al.

(10) Patent No.: US 10,164,316 B2
(45) Date of Patent: Dec. 25, 2018

(54) COMBINING ARRANGEMENT

(71) Applicant: TELEDYNE E2V (UK) LIMITED, Chelmsford, Essex (GB)

(72) Inventors: Michael John Duffield, Wivenhoe (GB); Craig Loch, Billericay (GB)

(73) Assignee: TELEDYNE E2V (UK) LIMITED, Chelmsford, Essex (GB)

( * ) Notice: Subject to any disclaimer, the term of this patent is extended or adjusted under 35 U.S.C. 154(b) by 0 days.

(21) Appl. No.: 15/082,201

(22) Filed: Mar. 28, 2016

(65) Prior Publication Data

US 2016/0322692 A1    Nov. 3, 2016

(30) Foreign Application Priority Data

Mar. 26, 2015   (GB) .................................. 1505202.0

(51) Int. Cl.
*H03K 3/03*       (2006.01)
*H01P 5/19*       (2006.01)
(Continued)

(52) U.S. Cl.
CPC .................. *H01P 5/19* (2013.01); *H01P 1/16* (2013.01); *H01P 1/161* (2013.01); *H03B 9/10* (2013.01);
(Continued)

(58) Field of Classification Search
CPC ...... H05H 7/00; H05H 2007/027; H03L 7/04; H03L 7/099; H01P 5/19; H01P 1/161;
(Continued)

(56) References Cited

U.S. PATENT DOCUMENTS 2,936,429 A    5/1960   Robinson et al.
3,063,026 A    11/1962  McFarland
(Continued)

FOREIGN PATENT DOCUMENTS

GB    0879677      10/1961
GB    879677 A *   10/1961
(Continued)

OTHER PUBLICATIONS

UK Search Report, dated Aug. 17, 2015, for related Application No. GB1505202.0.
(Continued)

*Primary Examiner* — Arnold Kinkead
(74) *Attorney, Agent, or Firm* — Fisherbroyles, LLP; Robert Kinberg

(57) ABSTRACT

A combining arrangement comprises a power combiner having at least four ports. A first match-dependent oscillator is connected to input power at a first frequency to a first input port of the power combiner. A second match-dependent oscillator is connected to input power at a second frequency to a second input port of the power combiner. A mismatch is connected to a third port of the power combiner. The power combiner is operative to combine power from the first and second oscillators and, when the first and second frequencies are different, to apply a fraction of the combined power to the mismatch. The mismatch reflects at least some of the fraction of the combined power to the first and second oscillators to phase and frequency lock their outputs. A fourth output port of the power combiner is connected to receive the combined power. The power combiner attenuation is variable to adjust the proportion of the combined power split between the third port and fourth output port from 0% to 100% of the total combined power for any power values at the first input port and second input port.

19 Claims, 5 Drawing Sheets

(51) Int. Cl.
*H01P 1/161* (2006.01)
*H01P 1/16* (2006.01)
*H03B 9/10* (2006.01)
*H03L 7/099* (2006.01)
*H05H 7/02* (2006.01)

(52) U.S. Cl.
CPC ...... *H03L 7/099* (2013.01); *H03B 2200/0074* (2013.01); *H03B 2200/0076* (2013.01); *H05H 2007/027* (2013.01)

(58) Field of Classification Search
CPC ..... H01P 1/16; H03B 9/10; H03B 2200/0074; H03B 2200/0076
USPC ....... 331/5, 46, 49, 2; 315/505; 333/100.117
See application file for complete search history.

(56) References Cited

U.S. PATENT DOCUMENTS

| | | | |
|---|---|---|---|
| 3,139,592 A * | 6/1964 | Sisson | H01P 1/19 331/17 |
| 4,048,583 A | 9/1977 | Nigrin | |
| 5,162,698 A | 11/1992 | Kato et al. | |
| 5,757,241 A | 5/1998 | Simonutti | |
| 7,952,439 B1 | 5/2011 | Heggemeier et al. | |
| 8,143,816 B2 * | 3/2012 | Clayton | H05H 7/02 315/39.51 |
| 2006/0208672 A1 | 9/2006 | Achenbach et al. | |
| 2010/0231144 A1 | 9/2010 | Leek | |

FOREIGN PATENT DOCUMENTS

| | | |
|---|---|---|
| GB | 2150376 A | 6/1985 |
| GB | 2228841 A | 9/1990 |
| WO | 01/052604 A1 | 7/2001 |
| WO | WO2007/076040 | 7/2007 |

OTHER PUBLICATIONS

GB Search Report, dated Jun. 15, 2016, for related Application No. GB1605254.0.

Extended EP Search Report, dated Aug. 18, 2016, for related EP Application No. 16162717.

Bostick, W. et al., Parallel Operation of Magnetrons, Research Laboratory of Electronics, MIT, Massachusetts, 1946.

David, Jr., E.E. et al., RF Phase Control of Pulsed Magnetrons, Proceedings of the IRE, 1952, vol. 40, No. 6, pp. 669-685.

Lewis, P. F., An Experiment in the Parallel Operation of High Power Magnetrons, Microwave Journal, 1970, vol. 13, No. 4, pp. 82-84.

Treado, T. A. et al., Experimental Results of Power Combining and Phase-Locking Magnetrons for Accelerator Applications, Electron Devices Meeting, 1990, IEDM 90, Technical Digest, International, San Francisco.

Pérez, F. et al., High Power Cavity Combiner for RF Amplifiers, Proceedings of EPAC, 2006, Edinburgh, Scotland.

Nantista, C. D. et al., A Compact, Planar, Eight-Port Waveguide Power Divider/Combiner: The Cross Potent Superhybrid, IEEE Microwave and Guided Wave Letters, 2000, vol. 10, No. 12, pp. 520-522.

Toshiba Industrial Magnetron E3327, Spec Sheet, 2014 Toshiba Corporation.

* cited by examiner

COMBINING ARRANGEMENT

CROSS-REFERENCE TO RELATED APPLICATION

This application claims priority to UK Application No. 1505202.0, filed Mar. 26, 2015, the disclosure of which is incorporated herein by reference in its entirety.

FIELD OF THE INVENTION

This invention relates to a combining arrangement and more particularly, but not exclusively, to an arrangement for combining the outputs of a plurality of magnetrons.

BACKGROUND

There are many applications in which it would be useful to combine the outputs of power sources to provide a higher combined output.

Magnetrons are one of the most efficient generators of high power RF in terms of their size and electronic efficiency. Unfortunately at higher RF power levels the magnetron design inherently starts to become less efficient, although the efficiency is still superior to many other types of device. One potential solution to achieve higher power levels is to combine the outputs of several magnetrons.

Where the power sources are magnetrons, it is generally desirable to use a technique that enables phase and frequency locking of the magnetron outputs so that they are in phase as this maximises the available combined output power. There are a number of different approaches that may be used to implement phase and frequency locking, for example, by signal injection from a seeding magnetron, by phase and frequency locking through power supply modulation or by power combining techniques. Power combining for arrangements using magnetrons may employ circulator technology which tends to be reliable but very expensive. Another approach uses hybrid technology but while this is cheaper it is not very effective in obtaining high power outputs.

BRIEF SUMMARY

According to the invention, a combining arrangement comprises: a variable attenuator power combiner having at least four ports; a first match-dependent oscillator connected to input power at a first frequency to a first input port of the power combiner; a second match-dependent oscillator connected to input power at a second frequency to a second input port of the power combiner; and a mismatch connected to a third port of the power combiner. The power combiner is operative to combine power from the first and second oscillators. When the first and second frequencies are different, the power combiner is operative to apply a fraction of the combined power to the mismatch, the mismatch reflecting at least some of the fraction to the first and second oscillators to phase and frequency lock their outputs. A fourth output port of the power combiner is connected to receive the combined power. The power combiner attenuation is variable to adjust the proportion of the combined power split between the third port and fourth output port from 0% to 100% of the total combined power for any power values at the 14 first input port and second input port. Typically most of the fraction is reflected to arrive at the first and second oscillators but there may be some losses at reflection and on transmission through the power combiner.

A match-dependent oscillator is one in which its output is dependent on how well its load is matched to it. In one embodiment of the invention, the first and second match-dependent oscillators are magnetrons. The invention is particularly advantageous where it is wished to combine the outputs of magnetrons operating at high RF field levels in the megawatt region. A combining arrangement using magnetrons with high combined output power may be suitable for many applications, such as for example, linear accelerators (linacs) or material processing and it is believed that power levels up to waveguide breakdown levels may be potentially be obtainable. In another embodiment, the first and second match-dependent oscillators are Gunn diode oscillators or another type of oscillator.

In one embodiment the oscillators are operated in a continuous wave (CW) mode. In another embodiment, the oscillators are operated to give a pulsed output. A magnetron with a pulsed output may sometimes miss a pulse. Where the oscillators are magnetrons, combining their outputs mitigates against missing pulses that may be detrimental to the operation of the magnetrons.

In a combining arrangement in accordance with the invention, when the first and second oscillators are out of phase some of the power leaks into the third port where the mismatch reflects a fraction back to the power combiner. The reflected signal is split into the first and second oscillators to provide phase and frequency locking. Thus the combining arrangement is self-correcting even when the first and second oscillators have outputs with different frequencies and phases during initial start-up or during operation. When a fraction is returned towards the oscillators, it travels along part of the same path as the combined power output but in the reverse direction. The locking signal is thus generated internally and does not require a separate external locking signal source and associated coupling components, hence reducing complexity and expense.

The power combiner may be a variable power divider/combiner in which a single power input can be selectively split between two output ports at a fraction from 0% to 100% of the input power by tuning the centre frequency of the device. Such devices are available as standard off-the-shelf components and are relatively inexpensive and readily obtainable. A suitable variable power divider/combiner may be, for example, the PDC1001 Variable Power Splitter available from MM Microwave Limited of Yorkshire, United Kingdom. In another embodiment, the power combiner is built from several off-the-shelf components. For example, it may include separate 3 dB hybrids combined with suitable waveguide sections.

In another embodiment, the fraction split is a fixed ratio and not able to be varied. However, in most circumstances this would not be as advantageous as a variable power combiner.

In one embodiment, the power combiner is a waveguide combiner. In another embodiment, it is a microstrip device.

The mismatch may be a variable mismatch such that the size of the fraction reflected is adjustable or it may be a fixed mismatch. However, a variable mismatch provides greater flexibility, giving controlled reflection of power back to the oscillator. Furthermore, variable mismatches are readily available as a standard off-the-shelf component, such as a stub tuner for example.

In one embodiment, the reflected fraction is split equally between the first and second ports. In another embodiment, the split is unequal. In an embodiment, the size of the fraction is up to half of the combined power from the first and second oscillators. In an embodiment, the fraction is 10% of the combined power.

In one embodiment, the power combiner is tuned to the banded interval frequency of the first and second oscillators. The banded interval frequency is a frequency in the interval between the first and second frequencies. In one embodiment, the banded interval frequency is the mean frequency of the first and second frequencies, that is, their sum divided by two. In another embodiment, the power combiner is tuned to a frequency higher or lower than the mean frequency and in the range between the first and second frequencies.

In one embodiment, the first and second frequencies are initially different at start up and the self-correcting characteristic of a combining arrangement in accordance with the invention enables phase and frequency locking to be subsequently achieved.

In an embodiment, a plurality of power combiners are included and connected together in series or in parallel or in both series and parallel to combine power from more than two match-dependent oscillators. In one embodiment, the power combiners are identical. In another embodiment, the power combiners have the same operating characteristics but are of different constructions.

By combining a number of high power magnetrons, for example, it may be possible to achieve combined output power levels at up to three times to tens of times magnetron peak RF levels without any loss in magnetron efficiency. By using an embodiment in accordance with the invention very high RF power levels may be achievable without the pulse width restrictions and efficiency reduction commonly associated with higher RF power levels. In one embodiment, high power S-band magnetrons may be combined to generate micro-second RF pulses of greater than 40 MW.

In one embodiment, a plurality of power combiners, each having at least four ports, is included and at least two of the power combiners are connected in series such that an output port of one power combiner is connected to an input port of another power combiner and a match-dependent oscillator is connected to another input port of the another power combiner. The combining arrangement may include more than two power combiners connected in series with one another, such that the output from the output port of one combiner acts as the input for the input port of the next power combiner and then that next power combiner is similarly connected in turn to another power combiner and so on. At each power combiner after the first, another match-dependent oscillator is added at the input port and a mismatch connected to a third port. Such an arrangement enables the output of two magnetrons, say, to be combined at a first power combiner and then the outputs of further magnetrons to be added depending on the number of additional power combiners. Thus an arrangement with four power combiners connected in series would allow up to five magnetron outputs to be combined. The output of the first power combiner, which is the combined signals from the first and second magnetrons, is fed to the second combiner. The mismatch of the second combiner reflects at least part of a fraction of the combined signals from the third magnetron and the output of the first combiner. This provides the third magnetron with a stable signal to couple to and enable phase and frequency locking. The output of the second power combiner then feeds the third power combiner and the output of the fourth magnetron is added, and so on.

In one embodiment, where the combining arrangement includes more than two power combiners connected in series and the oscillators are similar or identical, the reflected fraction at each combiner is split by an amount that takes into account that the power of the input from the previous combiner is greater than that of the oscillator added at that combiner. Thus a smaller proportion of the reflected signal is sent to the connected oscillator than to the other input of that combiner. This is controlled by suitably setting the frequency of each power combiner in the series.

The combining arrangement allows the power of an oscillator to be added in a sequential manner that is independent of the oscillator operating state, which is of particular advantage where the oscillators are magnetrons.

In an embodiment a plurality of power combiners, each having at least four ports, is included and at least two of the power combiners are connected in parallel such that an output port of one power combiner and an output port of another power combiner are connected to first and second input ports respectively of an additional combiner to give a combined output at an output port of the additional combiner. The additional combiner may be another power combiner similar or identical to those arranged in parallel with the output ports of the parallel combiners being connected to the first and second input ports of the additional combiner. The additional combiner may be different to the plurality of power combiners, for example, it could be a Magic-T combiner or some other type of combiner.

Where ports of the at least two power combiners are connected, this may be done by connecting one port directly to another port or there may be an intervening structure, such as a waveguide section, for example.

In the event of a failure of an individual oscillator, significant performance limitations may be avoided or reduced as, although the total output power is reduced, the failure of one oscillator should not significantly affect the operation of the other oscillators in the combining arrangement as they are isolated from one another. The variable attenuation provided by the power combiner enables the proportion of the combined power at the third and fourth ports to be adjusted for any power levels at the first and second input ports. For example, 100% of the combined power may be directed to the third port, or to the fourth port, or a percentage of the combined power may be directed to both the third and fourth ports. This provides a significant advantage if an oscillator connected to one input port fails because all of the power on the other input port may be directed to either the third port or the fourth output port. In contrast, a directional hybrid in such circumstances is not able to transmit all the power from the functioning oscillator to a selected single output. Instead the power from the single oscillator is split between the outputs. Where a plurality of combining steps are involved, this can reduce the output power of the entire system by significantly more than the power lost from the non-functioning oscillator alone.

In one embodiment, the power combiner comprises a plurality of pre-set values to adjust the proportion of the combined power split by pre-set amounts. The pre-set value may be selected by an operator. Alternatively, or in addition, control apparatus is included which is operative to automatically select a pre-set value depending on the operational state of the oscillators. For example, where the outputs of two magnetrons are to be combined, three pre-set values, that is 50%, 0% and 100%, may be available.

Combining magnetrons to produce a high power RF source provides a good solution for many applications especially as the electronic efficiency of the individual magnetron can be maintained at the combined system level. By using a combining arrangement including a plurality of power combiners, the arrangement can be scaled in frequency, RF power level and source multiplication factor, that is the number of oscillators. In some embodiments, standard off-the-shelf components may be used compared to previous approaches in which bespoke designs requiring extensive development programmes are required. Thus time to deployment for a particular embodiment may be significantly reduced.

BRIEF DESCRIPTION OF THE DRAWINGS

Some embodiments of the present invention will now be described by of example only, and with reference to the accompanying drawings, in which.

DETAILED DESCRIPTION

Figure 1:
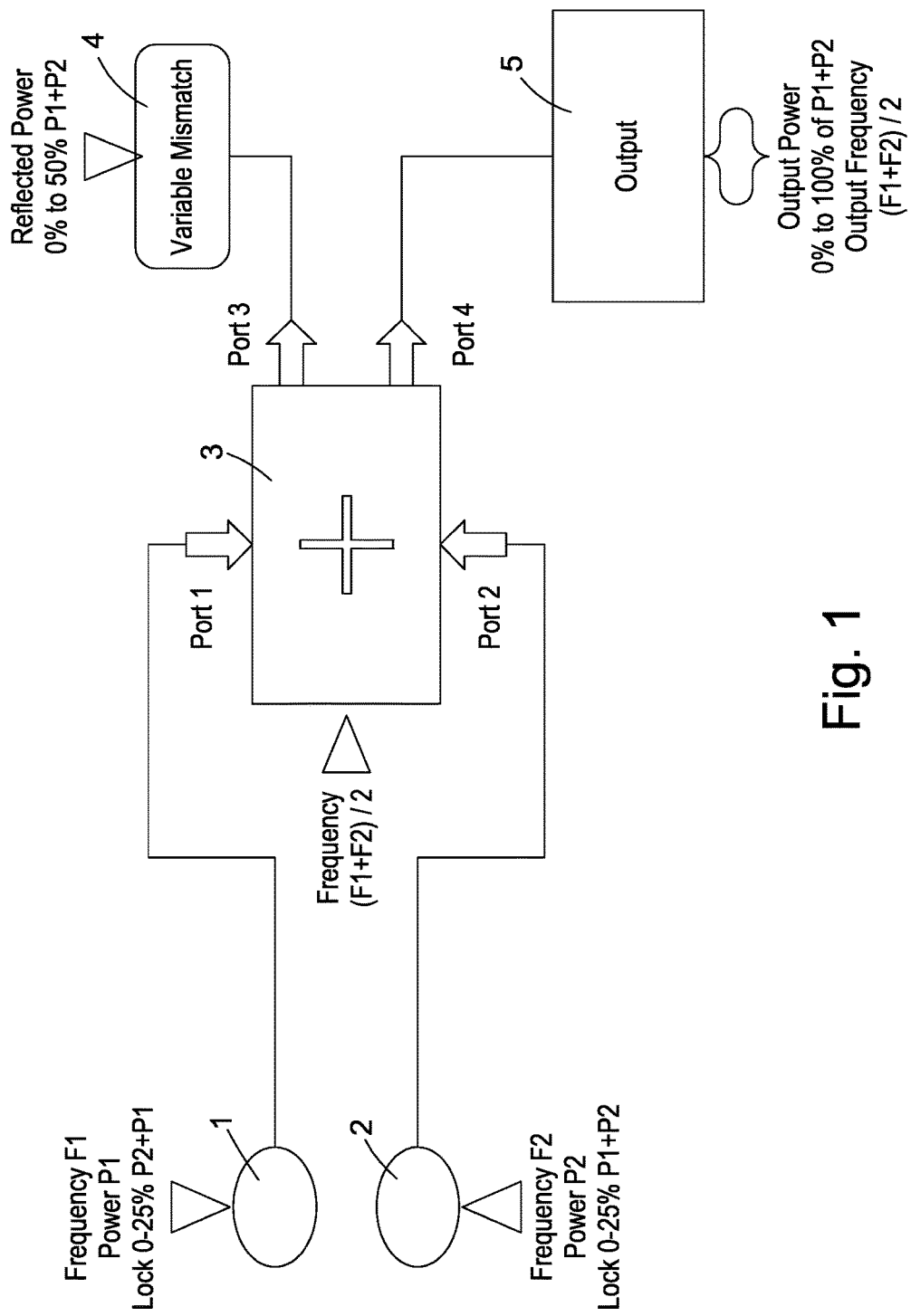
FIG. 1 schematically illustrates a combining arrangement in accordance with the invention.

With reference to FIG. 1, a combining arrangement includes a first magnetron 1 and a second magnetron 2 and a variable attenuator power combiner 3 having four ports, input port 1, input port 2, port 3 and output port 4. The first magnetron 1 is connected to port 1 and the second magnetron 2 to port 2. Port 3 is connected to a variable mismatch 4 and port 4 is the output 5 of the arrangement.

The outputs of the first magnetron 1 and the second magnetron 2 are at known frequencies F1, F2 and powers P1, P2. The magnetron output signals are delivered via ports 1 and 2 to the power combiner 3 which is tuned to the mean frequency of the magnetrons 1 and 2. If the frequencies F1 and F2 are different, a fraction of the combined magnetron power, in this case 10%, is leaked into port 3 where it is reflected by the variable mismatch 4. The reflected signal is split evenly into the first and second magnetrons 1 and 2 to obtain phase and frequency locking of their outputs.

The combined output power is transported to the output 5 of the power combiner at port 4 where it exits the combining arrangement with an output frequency which is the mean of the first and second magnetron frequencies and at a power level of the combined value of their outputs.

The combining arrangement is initially started with the output of the first magnetron 1 being split approximately 50:50 between ports 3 and 4 with a low mismatch value, the split being a function of deviance from the mean frequency. Then the second magnetron 2 is started. If the second magnetron 2 is started in phase, by virtue of signal interference, 100% of the signal is output to port 4. The more out of phase the second magnetron 2 starts relative to the first magnetron 1, the more power is present on port 3, this being proportional to the deviation in frequency from the locking frequency. By increasing the mismatch at port 3, more signal is reflected back to both ports 1 and 2, thereby encouraging self-correction and phase locking of the magnetrons 1 and 2.

Figure 2:
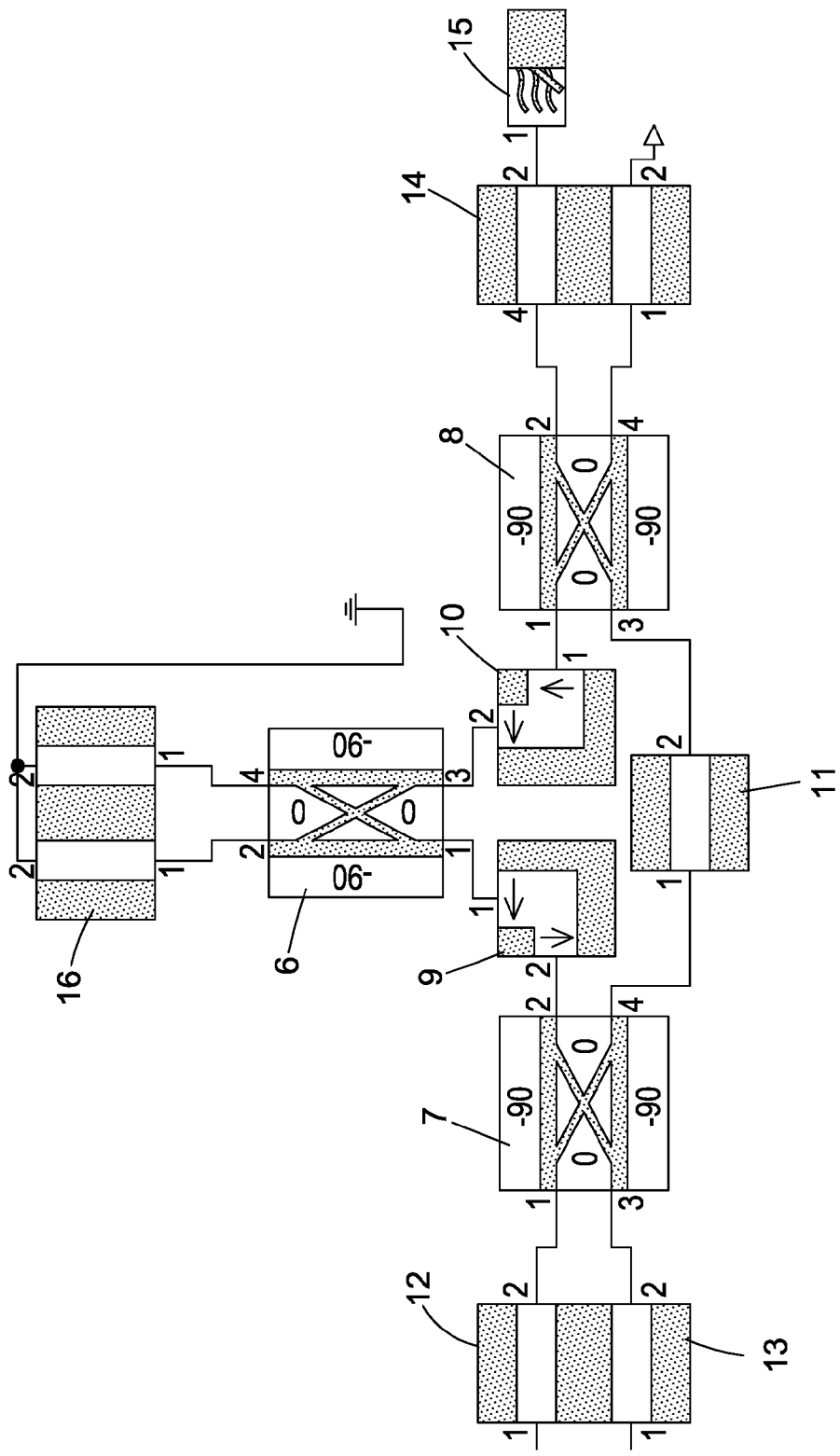
FIG. 2 schematically illustrates components of a combining arrangement.
Figure 3:
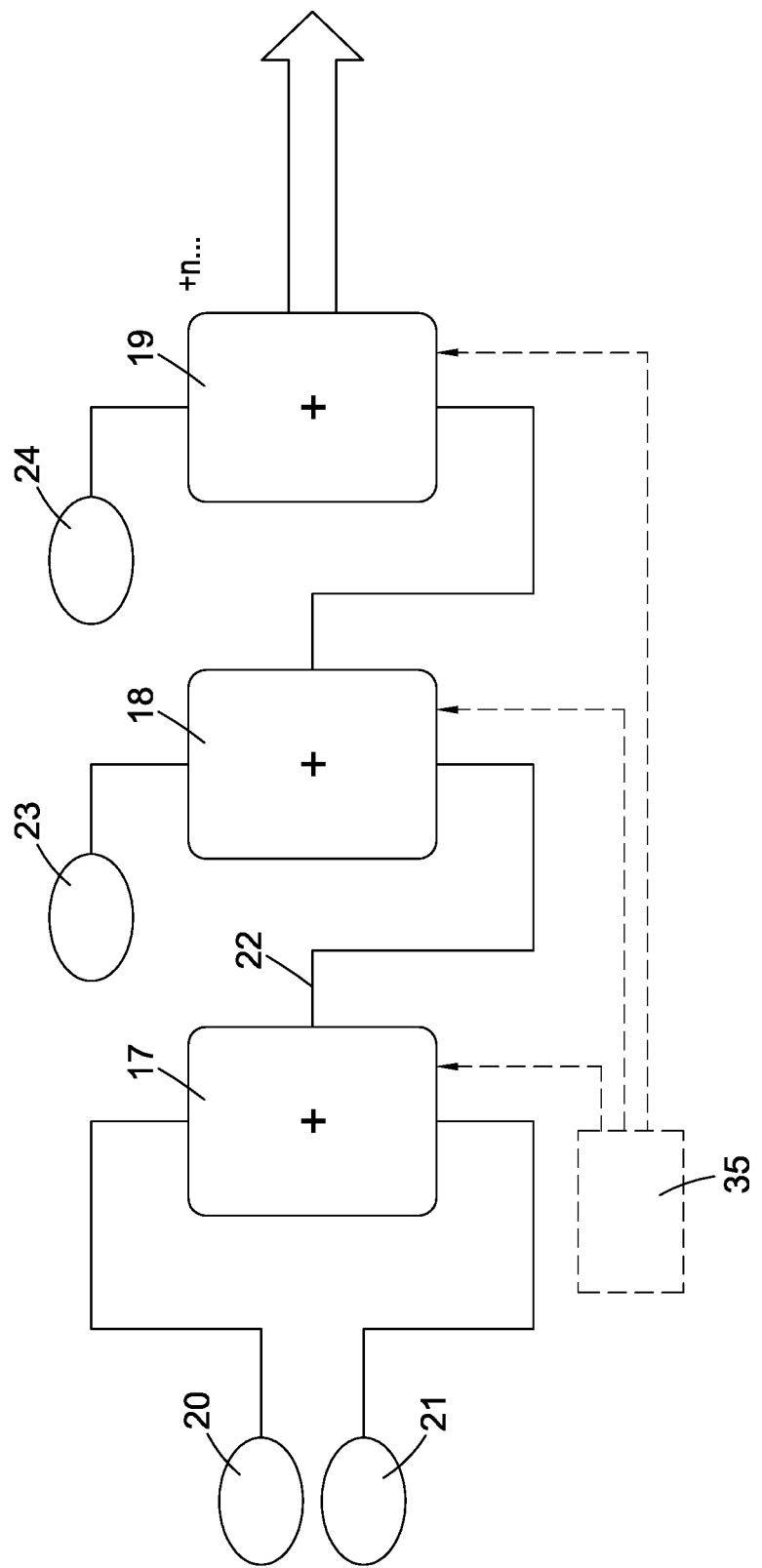
FIG. 3 schematically illustrates a combining arrangement in accordance with the invention and having power combiners in series.

With reference to FIG. 2, the variable attenuator power combiner of FIG. 1 may be assembled from off-the shelf components. Three 90 degree 3 dB hybrids 6, 7 and 8 are connected by two 90 degree waveguide bends 9 and 10 and a waveguide straight 11. The power combiner has first and second input ports 12 and 13 and a third port 14 which is connected to a variable mismatch or load 15. The output of the combiner is at the fourth port. A ganged sliding short circuit 16 provides frequency adjustability at port 1 (as shown) of 3 dB hybrid 8 and hence the distribution of power at its output ports 2 and 4. The short circuit 16 may be set in different positions so that the combined power is split by a selected amount to control the percentage of the combined power at the power combiner output. Thus if one of the magnetrons ceases to function, the variable attenuation provided by the sliding short circuit 16 is adjusted so that all of the power from the functioning magnetron is sent to the fourth output port. With reference to FIG. 3, a combining arrangement includes a plurality of power combiners 17, 18, 19, ... n connected in series. Each power combiner is similar to that shown in FIG. 1 and has four ports. Only three of the ports are shown, port 3 and the connected variable mismatch being omitted for clarity.

The first power combiner 17 receives inputs from first and second magnetrons 20 and 21 at ports 1 and 2 and provides a locked combined output on port 4 at 22. The output at 22 is then applied to port 2 of the second power combiner 18. Port 1 of the second power combiner 18 is connected to a third magnetron 23. A fraction of the combined input power of port 4 of the second combiner 18 and the third magnetron 23 is reflected back at the variable mismatch, split such that a smaller proportion is directed to the third magnetron 23. The self-correction capability ensures that the third magnetron 23 tends to quickly lock to the input on port 2. The output from the third magnetron 23 tends to be pulled in frequency towards the frequency of the signal on port 2, and not vice versa, because of the influence of the reflected fraction. The reflected fraction has little or no influence on the first and second magnetrons 20 and 21 as it returns to them via a relatively long path through the first power combiner 17. The output from port 4 of the second power combiner 18 is then applied to the next power combiner 19 at its port 2. A fourth magnetron 24 is connected to port 1 of the next power combiner 19 and is phase locks with the signal from port 2. The serialisation of the combining arrangement adds the benefit of not cancelling out 100% of the signal each time.

Each of the magnetrons can be isolated from each other as necessary for example, if one is faulty. As the magnetrons are isolated from one another, any missed pulses should only lower the output power slightly and full recovery is achieved on subsequent pulses. However, due to the geometry, the complete loss of one magnetron will result in a loss of 1.5 times the power of that magnetron. This can be corrected by adjusting the frequency of the power combiner to which the failed magnetron is connected and then adjusting the frequency of the next power combiner in the sequence and so on.

In the arrangement of FIG. 3, each additional oscillator after the first two is connected to port 1 of its associated power combiner. However, one or some of the additional oscillators could be connected to port 2 and the combined power connected to be applied at the other input port 1, for example. Similarly, the mismatch and combined output power could be at either port 3 or port 4. The operation of the power combiners is unchanged. This flexibility may be useful in meeting space constraints, for example.

Figure 4:
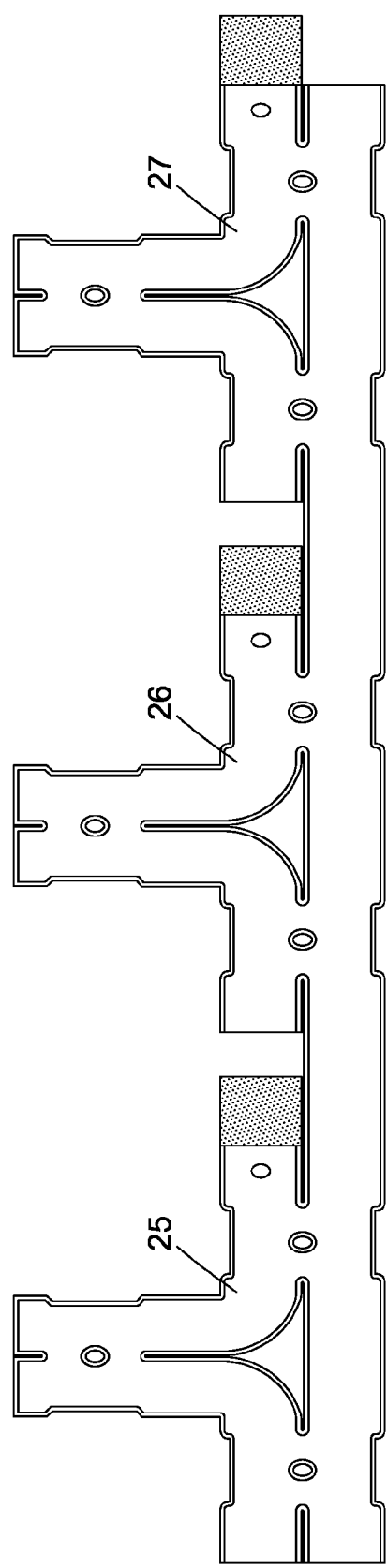
FIG. 4 schematically illustrates a combining arrangement in accordance with the invention and having power combiners in series.

With reference to FIG. 4, a combining arrangement includes three power combiners 25, 26 and 27 in series. In this embodiment, each power combiner is a single component.

Figure 5:
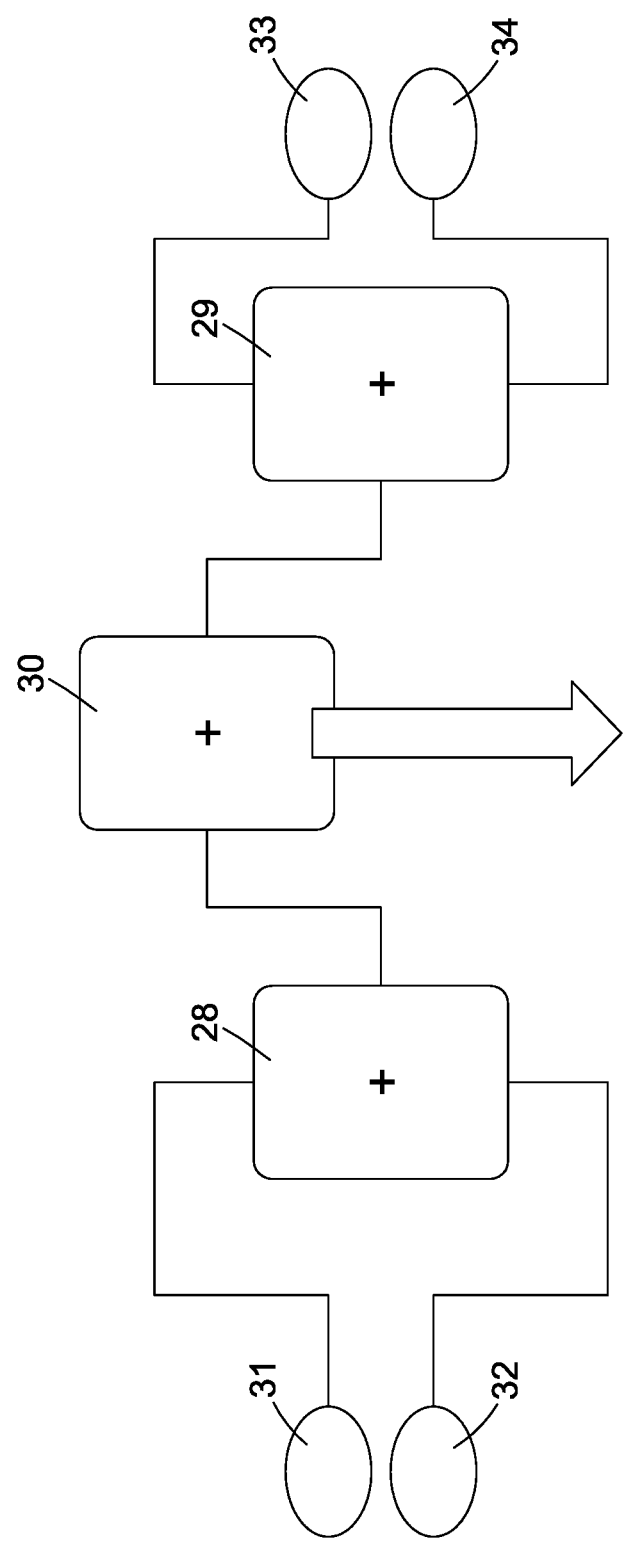
FIG. 5 schematically illustrates a combining arrangement in accordance with the invention and having power combiners in parallel.

With reference to FIG. 5, a combining arrangement includes two power combiners 28 and 29, each similar to that shown in FIG. 1, which are connected in parallel. The outputs of the power combiners 28 and 29 are combined at ports 1 and 2 of an additional combiner 30 which is also a power combiner as shown in FIG. 1. Oscillators 31, 32, 33 and 34 are connected to the input ports of the power combiners 28 and 29. The combined output power of the four oscillators exits the combining arrangement at port 4 of the additional combiner 30. This combining arrangement configuration has a different space requirement compared to that of a series-connected arrangement, which may be preferable for some applications.

In another arrangement, two series connected power combiners, such as shown in FIG. 3, have outputs which are combined in an additional combiner similar to the configuration of FIG. 5, so that the combining arrangement includes power combiners connected both in series and in parallel.

In an arrangement in accordance with the invention, the power combiner comprises a plurality of pre-set attenuation values to adjust the proportion of the combined power split by pre-set amounts. Thus where two magnetrons are involved, the values may be 0%, 50% and 100%, enabling a defective magnetron to be isolated without losing the power of the functioning magnetron. Where say three magnetrons are combined in a system with two combiners, the following pre-set values may be available:

| Active magnetrons | | | Combiner 1 | Combiner 2 | System combined output | Combined output if pre-set not adjusted |
|---|---|---|---|---|---|---|
| A | B | C | pre-set | pre-set | | |
| 1 | 1 | 1 | 50% | 66% | 3 | — |
| 1 | 0 | 1 | 100% | 50% | 2 | 1.33 |
| 0 | 1 | 1 | 0% | 50% | 2 | 1.33 |
| 1 | 1 | 0 | 50% | 100% | 2 | 1.34 |

The last column illustrates what happens to the system performance if the appropriate pre-set is not selected in the event of a magnetron failure. This is the optimum performance one could expect and it could be lower due to phase imbalance. The variable attenuator power combiner may have other pre-set values if desired.

The pre-set values may be selected manually by an operator. Alternatively or in addition, a control apparatus may be included, as shown at 35 on FIG. 3, to automatically select a pre-set value depending on the operational state of the magnetrons. When a defective magnetron is detected, for example, by its output declining, the system acts to isolate it from the system.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

We claim:

1. A combining arrangement comprising: a variable attenuator power combiner having at least four ports; a first match-dependent oscillator connected to input power at a first frequency to a first input port of the power combiner; a second match-dependent oscillator connected to input power at a second frequency to a second input port of the power combiner; and a mismatch connected to a third port of the power combiner; the power combiner being operative to combine power from the first and second oscillators and, when the first and second frequencies are different, to apply a fraction of the combined power to the mismatch, the mismatch reflecting at least some of the fraction to the first and second oscillators to phase and frequency lock their outputs, and a fourth output port of the power combiner being connected to receive the combined power, the power combiner attenuation being selectively variable to adjust the proportion of the combined power split between the third port and fourth output port from 0% to 100% of the total combined power for any power values at the first input port and second input port.

2. The arrangement as claimed in claim 1 wherein the reflected fraction is split equally between the first and second ports.

3. The arrangement as claimed in claim 1 wherein the reflected fraction is up to half of the combined power from the first and second oscillators.

4. The arrangement as claimed in claim 3 wherein the fraction is 10% of the combined power from the first and second oscillators.

5. The arrangement as claimed in claim 1 wherein the mismatch is variable such that the size of the fraction reflected is adjustable.

6. The arrangement as claimed in claim 5 wherein the mismatch is variable by an operator to adjust the size of the fraction.

7. The arrangement as claimed claim 1 wherein the power combiner is tuned to a banded interval frequency of the first and second oscillators.

8. The arrangement as claimed in claim 1 and including more than two match-dependent oscillators and a plurality of variable attenuator power combiners each having at least four ports, said plurality being connected to combine power from the more than two oscillators.

9. The arrangement as claimed in claim 8 wherein at least two of the power combiners of said plurality are connected in parallel such that an output port of one power combiner and an output port of another power combiner are connected to first and second input ports respectively of an additional combiner to give a combined output at an output port of the additional combiner.

10. The arrangement as claimed in claim 8 wherein the power combiners of said plurality are identical power combiners.

11. The arrangement as claimed in claim 9 wherein the additional combiner and the power combiners of said plurality are identical.

12. The arrangement as claimed in claim 1 wherein the match-dependent oscillators are magnetrons.

13. The arrangement as claimed in claim 1 wherein the oscillators are pulsed output oscillators.

14. The arrangement as claimed in claim 1 wherein the oscillators are continuous wave output oscillators.

15. The arrangement as claimed in claim 1 wherein the or each power combiner is a waveguide combiner.

16. The arrangement as claimed in claim 1 wherein the power combiner comprises a plurality of pre-set values to adjust the proportion of the combined power split by pre-set amounts.

17. The arrangement as claimed in claim 16 wherein the pre-set value is selected by an operator.

18. The arrangement as claimed in claim 16 and including control apparatus operative to automatically select a pre-set value depending on the operational state of the oscillators.

19. A combining arrangement comprising: more than two match-dependent oscillators and a plurality of variable attenuator power combiners each having at least four ports, said plurality being connected to combine power from the more than two matched-dependent oscillators; a first match-dependent oscillator being connected to input power at a first frequency to a first input port of one of the power combiners; a second match-dependent oscillator connected to input power at a second frequency to a second input port of the one power combiner; and a mismatch connected to a third port of the one power combiner; the one power combiner being operative to combine power from the first and second oscillators and, when the first and second frequencies are different, to apply a fraction of the combined power to the mismatch, the mismatch reflecting at least some of the fraction to the first and second oscillators to phase and frequency lock their outputs, and a fourth output port of the one power combiner being connected to receive the combined power, a power combiner attenuation of the one power combiner being variable to adjust the proportion of the combined power split between the third port and fourth output port from 0% to 100% of the total combined power for any power values at the first input port and second input port, wherein at least two of the power combiners of said plurality are connected in series such that an output port of the one power combiner is connected to an input port of another power combiner and another match-dependent oscillator of said more than two match-dependent oscillators is connected to another input port of the another power combiner.

* * * * *